United States Patent [19]

Chang et al.

[11] 4,239,584
[45] Dec. 16, 1980

[54] MOLECULAR-BEAM EPITAXY SYSTEM AND METHOD INCLUDING HYDROGEN TREATMENT

[75] Inventors: Chin-An Chang, Peekskill; Leroy L. Chang, Mohegan; Leo Esaki, Chappaqua, all of N.Y.

[73] Assignee: International Business Machines Corporation, Armonk, N.Y.

[21] Appl. No.: 947,912

[22] Filed: Sep. 29, 1978

Related U.S. Application Data

[63] Continuation-in-part of Ser. No. 800,827, May 26, 1977, abandoned.

[51] Int. Cl.³ .............................................. B05D 3/06
[52] U.S. Cl. ............................. 156/612; 148/175; 156/614; 156/DIG. 103; 427/86; 427/87; 427/91; 427/250; 427/294; 427/255.1; 427/255.2
[58] Field of Search ................. 427/86, 87, 85, 38, 427/294, 248 B, 248 A, 250, 399, 91; 156/DIG. 103, 612, 614; 148/175

[56] References Cited

U.S. PATENT DOCUMENTS

| | | | |
|---|---|---|---|
| 3,615,931 | 10/1971 | Arthur et al. | 148/175 |
| 3,673,011 | 6/1972 | Strull | 148/175 |
| 3,765,960 | 10/1973 | Boss et al. | 148/175 |
| 3,839,084 | 10/1974 | Cho et al. | 148/175 |
| 3,888,705 | 6/1975 | Fletcher et al. | . |
| 3,900,363 | 8/1975 | Teraoka et al. | . |
| 4,058,430 | 11/1977 | Suntola et al. | 427/248 B |
| 4,058,430 | 1/1978 | Manasevit | 427/87 |

Primary Examiner—Ronald H. Smith
Assistant Examiner—Janyce A. Bell
Attorney, Agent, or Firm—John J. Goodwin

[57] ABSTRACT

A system and method including the use of hydrogen in the molecular beam evaporation process for epitaxy growth, such as in the formation of GaAs and GaAlAs and Sn for n-type dopant impurity. In a molecular beam epitaxy system, a hydrogen beam introduced and, along with the molecular beam, is directed on the substrate during the epitaxy growth such that the presence of the relatively small volume of hydrogen influences the physical surface properties of the epitaxially grown material and therefore the quality of the epitaxy.

2 Claims, 1 Drawing Figure

U.S. Patent      Dec. 16, 1980      4,239,584
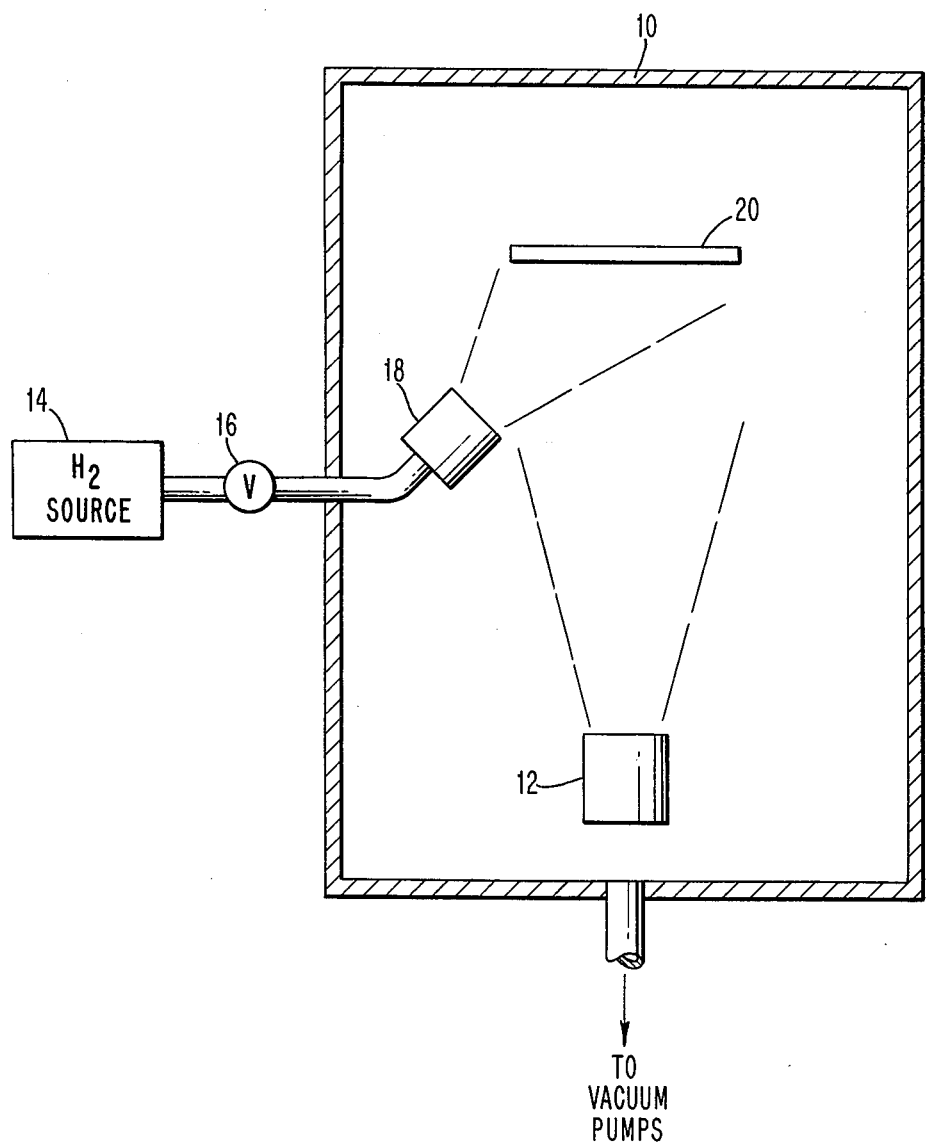

MOLECULAR-BEAM EPITAXY SYSTEM AND METHOD INCLUDING HYDROGEN TREATMENT

The government has rights in this invention pursuant to Contract No. AAG-29-76-C-0032 awarded by the U.S. Army Research department.

CROSS-REFERENCE TO RELATED APPLICATION

This application is a continuation-in-part of application Ser. No. 800,827, filed May 26, 1977, now abandoned, entitled MOLECULAR-BEAM EPITAXY SYSTEM AND METHOD INCLUDING HYDROGEN TREATMENT, which is assigned to the same assignee as the present invention.

BACKGROUND OF THE INVENTION

1. Field of the Invention

The present invention relates to an improved molecular-beam epitaxy system and method, and more particularly to a molecular-beam epitaxy system wherein hydrogen is introduced and employed to change the physical surface properties of the epitaxially grown material and to improve the adsorption property and the quality of the epitaxy.

2. Description of the Prior Art

Molecular-beam epitaxy as a method for epitaxial growth of compound semiconductor films by a process involving the reaction of one or more thermal molecular beams with a crystalline surface under ultra-high vacuum conditions is well known in the art.

A complete discussion of the molecular-beam epitaxy process and the structures for carrying it out is provided by the publication *Progress in Solid State Chemistry*, Vol. 10 part 3, 1975 in the article "Molecular Beam Epitaxy" by A. Y. Cho and J. R. Arthur at page 157.

Another extensive discussion of the prior art of molecular-beam epitaxy is found in the text *Epitaxial Growth Part A* of the Materials Science Series. The article "Molecular-Beam Epitaxy" by L. L. Change and R. Ludeke, Section 2.2, pages 37–72 presents a treatise on the theory and techniques employed in the prior art.

The applicants' invention is directed to the use of hydrogen in a molecular-beam epitaxy system to change the physical surface properties of the epitaxially grown material. The use of hydrogen is known in the chemical vapor deposition process as indicated by the publication to R. C. Clark et al, "The Preparation of High Purity Epitaxial In P", *Solid State Communications*, Vol. 8 (1970), pp. 1125–1128. In a chemical vapor deposition process it is well known that large volumes of hydrogen under high pressure produce an active chemical reaction in the formation of the chemical vapor. For example, in the Clarke et al publication the hydrogen chemically reacts with $PCl_3$ to produce hydrogen chloride (HCl) and the phosphorous vapor.

In the applicants' invention there is no chemical reaction and the hydrogen is introduced in small volumes under low pressure (ultra-high vacuum) to produce a physical change.

There is no teaching in the prior art relative to the unique use of hydrogen in the molecular-beam evaporation process for epitaxy growth as provided by the present invention, and a review of the prior art will indicate that such use of hydrogen as in the present invention is an unusual and unexpected technique.

SUMMARY OF THE INVENTION

An object of the present invention is to provide an improved process and system for the molecular-beam evaporation epitaxy growth including the presence of hydrogen.

Another object of the present invention is to provide an improved process and system for molecular-beam epitaxy including a hydrogen beam directed onto the substrate.

A further object of the present invention is to provide an improved molecular-beam epitaxy system and method for the formation of GaAs or GaAlAs and Sn for n-dopant impurity wherein a relatively small volume of hydrogen is used in the growth process.

The foregoing and other objects, features and advantages of the invention will be apparent from the following more particular description of a preferred embodiment of the invention, as illustrated in the accompanying drawings.

BRIEF DESCRIPTION OF THE DRAWINGS

The FIGURE of the drawing is a schematic illustration of a molecular-beam epitaxy system including means for introducing a beam of hydrogen.

DESCRIPTION OF THE PREFERRED EMBODIMENT

Referring to the drawing a schematic illustration of a molecular-beam epitaxy system is shown including the basic vacuum chamber or enclosure 10, the interior of which is maintained at an ultra-high vacuum condition by vacuum pumps. A single source 12, such as Ga, Al, As or Sn is shown inside chamber 10, however more than one source of the above or other materials may be generally represented by element 12 depending on the desired growth application. A substrate 20 is also included in chamber 10. The structure described and illustrated up to this point represents a conventional molecular-beam epitaxy system well known in the prior art. It is to be appreciated that in actual practice there are several other components and devices employed in the system. A more complete arrangement is illustrated in FIG. 1 of the Chang and Ludeke publication in the previously mentioned text *Epitaxial Growth* and includes such elements as source heaters, source shutters, substrate holders, substrate heaters, substrate shutters, shrouds, electron guns, screens and other state-of-the-art components of a working system. These elements have been omitted from the drawing for simplicity since their operation and purpose are well known.

A novel aspect of the molecular-beam epitaxy system in the drawing is the hydrogen source 14, which is used to introduce a beam of hydrogen into chamber 10 via a conduit controlled by valve 16. The hydrogen beam may optionally be atomized or ionized by the atomizer or ionizer structure 18.

Molecular-beam epitaxy is a term used to denote the epitaxial growth of compound semiconductor films by a process involving the reaction of one or more thermal molecular beams with a crystalline surface under ultra-high vacuum conditions.

A molecular-beam is defined as a directed ray of neutral molecules or atoms in a vacuum system. The beam density is low and the vacuum high so that no appreciable collisions occur among the beam molecules and between the beam and the background vapor. The beam is usually produced by heating a solid substance contained in an effusion cell. The orifice dimension of the cell is small compared to the mean free path of the vapor in the cell so that flow of the molecules into the vacuum chamber is by effusion. Quasi-equilibrium exists in the cell so that both the vapor composition and the effusion rates of the beam are constant and are predictable from thermodynamics, in contrast to the case of free evaporation.

The beam is guided by the orifice and possibly by other slits and shutters onto a substrate where the situation is usually far from equilibrium. Under proper conditions, governed mainly by kinetics, the beam would condense resulting in nucleation and growth.

Referring to FIG. 1, it is again stated that the conventional elements employed in a typical molecular beam epitaxy system, such as ion pumps, sublimation pumps, liquid nitrogen shrouds, source overuns (i.e. resistively heated effusion cells composed for example of graphite or boron nitride), thermocouples, source shutters, substrate shutters, and substrate holders have been omitted from FIG. 1 for simplicity since the operation of such system is well explained in the prior art literature.

The substrate 20 is usually a monocrystalline material that has been cleaned, polished and etched. It may or may not be the same material as that to be deposited, depending on whether homoepitaxy is desired. The substrate 20 during deposition, is kept at elevated temperatures, which are usually necessary for epitaxial growth. It can also be heated before deposition primarily for cleaning and afterwards for various heat treatments.

Source 12, in the present application, is meant to represent either a single source material or a plurality of source materials for producing multilayered or compound films and the aforesaid supporting equipment, such as heaters, thermocoupler and shroud.

The present invention is directed to the improvement of the molecular-beam epitaxy method and system wherein a beam of hydrogen is introduced which results in improvements in physical surface properties such as component and impurity adsorption properties, material surface smoothness, electron mobility, photoluminescence and doping incorporation. The hydrogen beam is provided by a hydrogen source 14 which selectively supplies a relatively low volume of hydrogen into chamber 10 through valve 16 and orifice 18.

The introduction of hydrogen into the molecular-beam epitaxy process produces superior results for the following reasons. One of the most serious impediments to maximum quality molecular-beam epitaxy grown samples is the presence of oxygen. When oxygen gets into the sample film it forms deep levels that act as traps for the charge carriers and greatly affect the electronic properties of the films grown. The oxygen problem is especially pronounced in the presence of Al, such as in the growth of GaAlAs, a commonly desired sample. To overcome the oxygen problem, the present invention uses the introduction of hydrogen to remove the oxygen from the surface during growth.

In a given application in growing two GaAlAs samples, one using hydrogen according to the present invention and one without hydrogen, it was found that the sample grown in the hydrogen environment exhibited a three times increase in measured carrier concentration and a five times increase in electron mobility. The simultaneous increase in carrier concentration normally leads to a decrease in mobility. A further result was a ten times increase in photoluminescence.

In a typical embodiment of the invention in the molecular-beam epitaxy process for the growth of GaAs, the arrival rate of the hydrogen from source 14 of FIG. 1 into chamber 10 is controlled by valve 16 to introduce a relatively low volume of hydrogen into chamber 10. The Ga arrival rate on the substrate surface is $4 \times 10^{14}$ atoms/cm$^2$-sec for a growth rate of 2A/sec of GaAs. At this GaAs growth rate, the required hydrogen arrival rate on the substrate surface for the described improvement is $\sim 10^{14}$–$10^{15}$ molecules/cm$^2$-sec. This flowrate of hydrogen alone increased the chamber pressure from $2 \times 10^{-10}$ Torr to $5 \times 10^{-9}$ Torr. In comparison, the chamber pressure increased to $1 \times 10^{-7}$ Torr during the molecular-beam epitaxy growth of GaAs (at 2A/sec rate) due mainly to the high vapor pressure of As needed for such growth. Of course, the hydrogen flow rate can be adjusted in accordance with the particular geometry of the molecular-beam epitaxy system being employed in order to obtain the desired hydrogen flow rate.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a molecular-beam epitaxy process for the epitaxial growth of compound semiconductor films in an enclosed vacuum chamber including at least one source material selected from the group comprising gallium, arsenic, aluminum and tin, and a substrate on which the source material is epitaxially grown, the improvement comprising the steps of providing a source of hydrogen, and the step of introducing a controlled relatively low volume of said hydrogen from said hydrogen source through a control valve into said vacuum chamber while said source material is being epitaxially grown on said substrate for changing the physical properties of the surface of said epitaxially grown material on said substrate by combining with and removing any oxygen present on the surface of said epitaxially grown material on said substrate for increasing the adsorption properties of said epitaxially grown material.

2. A molecular-beam epitaxy process according to claim 1 wherein said source material includes Ga having an arrival rate on said substrate of substantially $4 \times 10^{14}$ atoms per square centimeter per second and the flow rate of said hydrogen introduced into said vacuum chamber is between $10^{14}$ to $10^{15}$ molecules per square centimeter per second.

* * * * *